(12) United States Patent
van Gemert et al.

(10) Patent No.: US 9,385,099 B2
(45) Date of Patent: Jul. 5, 2016

(54) DIE INTERCONNECT

(71) Applicant: NXP B.V., Eindhoven (NL)

(72) Inventors: Leonardus Antonius Elisabeth van Gemert, Nijmegen (NL); Coenraad Cornelis Tak, Waalre (NL); Marten Oldsen, Kleve (DE); Hendrik Bouman, Nijmegen (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/229,717

(22) Filed: Mar. 28, 2014

(65) Prior Publication Data

US 2015/0279803 A1 Oct. 1, 2015

(51) Int. Cl.
| | |
|---|---|
| *H01L 21/44* | (2006.01) |
| *H01L 23/66* | (2006.01) |
| *H01L 23/58* | (2006.01) |
| *H01L 23/00* | (2006.01) |
| *B81B 7/00* | (2006.01) |

(52) U.S. Cl.
CPC ............... *H01L 24/17* (2013.01); *B81B 7/007* (2013.01); *B81B 7/0048* (2013.01); *H01L 24/11* (2013.01); *H01L 24/14* (2013.01); *H01L 2224/1401* (2013.01); *H01L 2224/1701* (2013.01); *H01L 2924/35* (2013.01)

(58) Field of Classification Search
CPC .. H01L 23/49572; H01L 24/17; H05K 1/188; B81B 7/0048
USPC .................................. 257/737, 202; 438/613
See application file for complete search history.

(56) References Cited

U.S. PATENT DOCUMENTS

| | | | |
|---|---|---|---|
| 2002/0146919 A1 | 10/2002 | Cohn | |
| 2003/0038157 A1 | 2/2003 | Gebauer et al. | |
| 2004/0065915 A1* | 4/2004 | Honda | G06K 9/0002 257/303 |
| 2006/0032669 A1* | 2/2006 | Kawakami | H05K 1/147 174/261 |
| 2006/0208357 A1 | 9/2006 | Meyer et al. | |
| 2008/0290430 A1* | 11/2008 | Mahadevan | B81B 7/0048 257/418 |
| 2011/0230068 A1 | 9/2011 | Pahl | |
| 2012/0288241 A1* | 11/2012 | Rosenberg | H05K 1/141 385/93 |
| 2015/0049443 A1* | 2/2015 | Meyer-Berg | 361/749 |
| 2015/0083312 A1* | 3/2015 | Sun et al. | 156/248 |

OTHER PUBLICATIONS

Extended European Search Report for Patent Appln. No. 15159573.3 (Dec. 14, 2015).

* cited by examiner

*Primary Examiner* — Moazzam Hossain

(57) ABSTRACT

One example embodiment discloses a chip having a chip area, wherein the chip area includes: an overhang area; a rigid coupling area, having a set of rigid coupling points, located on one side of the overhang area; and a flexible coupling area, having a set of flexible coupling points, located on a side of the overhang area opposite to the a rigid coupling area. Another example embodiment discloses a method for fabricating a die interconnect, comprising: fabricating a rigid coupler area, having a set of rigid coupler points, within a chip having a chip area; defining an overhang area within the chip area and abutted to the rigid coupler area; and fabricating a flexible coupler area, having a set of flexible coupler points, within the chip area abutted to a side of the overhang area opposite to the rigid coupler area.

14 Claims, 5 Drawing Sheets

DIE INTERCONNECT

BACKGROUND

Brief Background Introduction

This specification relates generally to device attachments and in one example to a die interconnect.

Figures 1A, 1B:
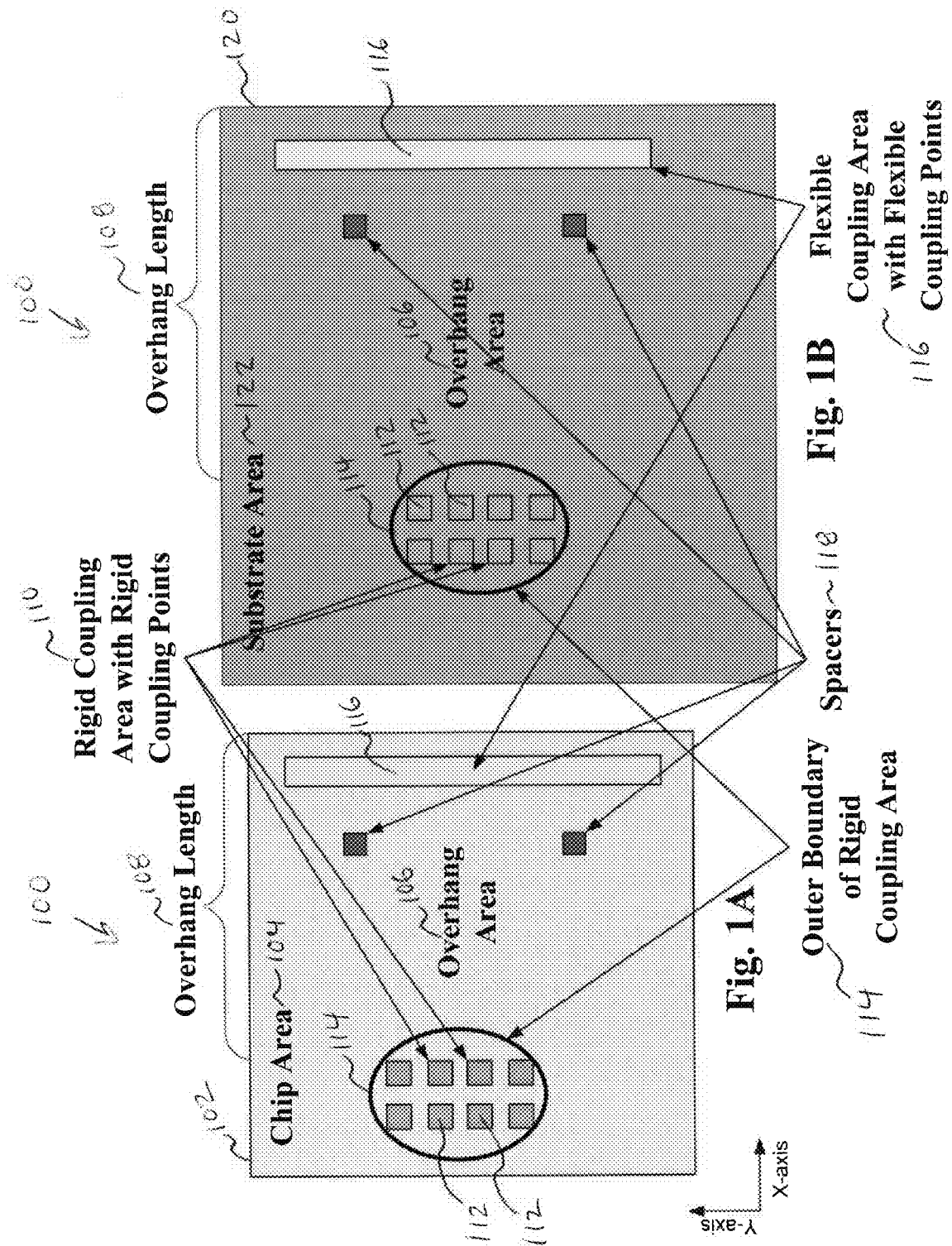
FIG. 1A shows one example of a die interconnect on a chip.
FIG. 1B shows one example of a die interconnect on a substrate.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Semiconductor devices whose input/output (IO) pins are spread out over the chip surface can result in a very stiff connection between a chip and substrate such that thermal mismatch between chip and substrate results in chip stresses.

Semiconductor devices include sensors (e.g. pressure sensors). Such sensors, dependent on the design, are sensitive to stress on an Si die (e.g. a silicon chip) which will affect the sensor's sensitivity and accuracy.

Stress on Si sensor chip can be generated when materials with different thermo-mechanical properties are connected together. This stress is an effect of a difference in coefficients of thermal expansion (CTE) and in combination with the modulus of the material, leads to stresses. Temperature changes in this case lead to a variation in stress. Also Humidity variations can lead to stress variations especially when organic materials are used. The chip itself can generally cope with these stresses but the sensor which is processed on the chip surface will be affected by minimal amounts of stress change. Also when organic materials or metals are used variation in stress (e.g. relaxation) over time can happen due to creep effects of these materials. As some Si sensors are used for absolute measurements stress variation over time could create inaccurate sensor signals.

Mounting the Si chip on a substrate with similar coefficients of thermal expansion may not always result in the best or most economical solution. Other alternatives using wire-bonds and flexible glues in pre-molded or cavity packages can lead to increase in size and cost.

In one example embodiment discussed in more detail below, chip stress is minimized by fixing the chip on one relatively small area, using flip chip interconnect, thereby letting the chip freely expand in all directions. Flip chip in general is a very stiff construction not allowing for stress relief but by using a small area with fine pitch interconnections between chip and substrate the stress is minimal and localized in that small area. The rest of the chip remains stress free. By grouping all interconnects on a small area, the mismatch in thermal expansion is reduced and thus the absolute stress is reduced (small distance), so that the remainder of the chip remains free from stress including a sensor area.

With the contact between the Si chip and the carrier substrate minimized, the majority of the chip is free to expand and contract due to temperature variations without building up stress on not contacted areas. The area which is in contact with the carrier substrate is kept minimal. This set of rigid coupling points can be located at various chip locations and be arranged in different patterns. In such embodiments, the stress build up increases with the dimension of the contact. The smaller this contact the smaller the stress. An area which is sensitive for the stress can be on a different location on the Si chip.

Details of the present claimed device/service are now discussed.

FIG. 1A shows one example of a die interconnect 100 on a chip 102. FIG. 1B shows one example of the die interconnect 100 on a substrate 120. Thus the die interconnect 100 can be first fabricated on either the chip 102 or the substrate 120 before the chip 102 and substrate 120 are connected together by the die interconnect 100 thereby forming a package. Chip and die are used interchangeably in this specification and refer to a circuit element or a collection of circuit elements.

The die interconnect 100 includes the chip 102 having a chip area 104, or alternately the substrate 120 having a substrate area 122. The chip and substrate areas 104, 122 include an overhang area 106, a rigid coupling area 110 and a flexible coupling area 116. The rigid coupling area 110 includes a set of rigid coupling points 112, located on one side of the overhang area 106. The flexible coupling area 116, includes a set of flexible coupling points 306, located on a side of the overhang area 106 opposite to the a rigid coupling area 110. In one example, the rigid coupling points 112 are electrical coupling points and the flexible coupling points 306 are mechanical coupling points.

In an example embodiment, the rigid coupling points 112 are formed from anisotropic conductive adhesive (ACA) glue. When placed between two closely spaced metal surfaces, the ACA glue shrinks when cured and silver particles within the ACA create an electrical contact between the two metal surfaces. ACA glue does not conduct in the x-y axis directions. ACA glue may be deposited on the chip 102 or substrate 120 using either a lamination, dispense or screen printing process.

In another example embodiment, the ACA glue is replaced by rigid solder bumps, copper (Cu) stud-bumps or a wire bond. Use of ACA glue however enables a pitch (i.e. distance) between the electrical contacts to be smaller than solder connections would permit. The ACA glue can also be replaced by a NCA (Non Conductive Adhesive) along with Cu stud bumps having an Sn cap that allows soldering on to the substrate. Pitch using the NCA-type interconnect may be low as well. In other examples, the ACA glue can be applied in the shape of an anisotropic conductive paste (ACP) or in the shape of anisotropic conductive foil (ACF)

The flexible coupling points in the flexible coupling area 116, in one example, are formed from a soft flexible, non-conductive, glue which flexes along x-y-z axes to avoid stress build-up. Glues from the silicone family of glues that permit in plane movement can be used in this flexible coupling area.

In an example embodiment, a set of spacers 118 are located within either the overhang area 106 or the flexible coupling area 116. The spacers 118 prevent tilting during the package assembly process and help ensure a relatively constant gap between the Si chip 102 and the substrate 120. These spacers 118 can be either filler particles in a soft glue or additional bumps similar to the ones which form the rigid or flexible coupling points. In one example, the spacer bumps 118 are fixed to the chip 102 but not to the substrate 120 and thus can slide over the substrate 120 without adding stress to the chip 102.

The rigid coupling area 110 is within an outer boundary 114 and the flexible coupling area 116 and overhang area 106 are outside of the outer boundary 114. In one example, the outer boundary 114 encloses up to 50% of the chip area 104. In another example, the chip or substrate area 104, 122 is defined by a x-axis length and a y-axis width, and the overhang area 106 has an x-axis overhang length 108 which is at least 50% of the chip or substrate area's 104 or 122 x-axis length. However in other examples, the % overlap can range from 1% to 99%.

In different example embodiments, the substrate 120 could be a second chip, a circuit board or glass.

Figure 2:
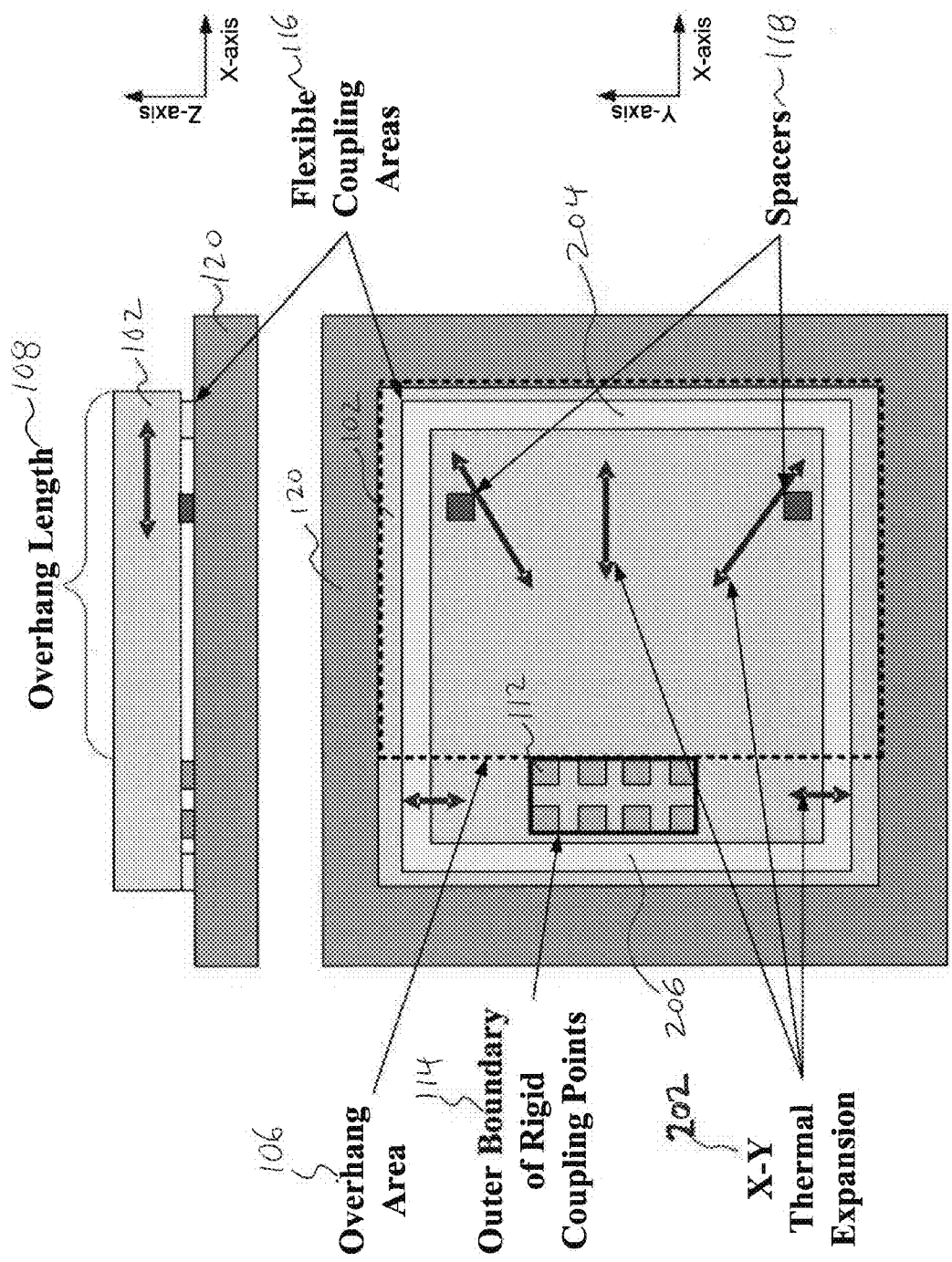
FIG. 2 shows one example of a die interconnect between a chip and a substrate.

FIG. 2 is one example of a die interconnect 100 between a chip 102 and a substrate 120. In this example the chip 102 has already been connected to the substrate 120 using the die interconnect 100 thereby forming a package. For clarity, in the x-y view of the package of FIG. 2 the chip 102 is transparent so that the die interconnect 100 can be seen. FIG. 2 shows an example of how the chip 102 can be fixed to a substrate 120 on only a small area. As such the stress build up between the Si chip 102 and substrate 120 is minimized.

The chip 102 is coupled to the substrate 120 with the set of rigid 112 and flexible coupling points in the flexible coupling area 116. As shown in FIG. 2, the flexible coupling area 116 can be on a side of the overhang area 106 opposite to 204 the rigid coupling points 112. Alternatively, the flexible coupling area 116 can be adjacent to 206 the rigid coupling points 112 and on a same side of the overhang area 106 as the rigid coupling points 112. Several options for connecting the chip 102 to the substrate 120 are possible.

In one example both the conductive ACA glue and the non-conductive silicone glue are applied to the chip 102 or substrate 120. The chip 102 is then placed in position over the substrate 120 and the two are pressed together to mount the chip 102 to the substrate 120.

In another example, the conductive ACA glue is applied to the chip 102 or substrate 120, the chip 102 and substrate 120 are connected, the ACA glue is cured and then a fillet of silicone glue is placed around the outside edge of the chip 102 and onto the substrate 120 below and the silicone is cured.

FIG. 2 also shows an example of how the optional spacer bump 118 keeps the chip 102 and substrate 120 at a relatively constant distance. After the chip and substrate are coupled, an additional fillet of the flexible glue can also be applied around the or on several points to further fix the chip. After curing the substrate array can be cut into individual packages using chip singulation, punching or other separation technique. Optionally a cap could be placed over the chip (e.g. Si chip) for mechanical protection.

With the rigid coupling points 112 localized on the chip 102 x-y thermal expansion 202 can more easily be accommodated resulting in less chip 102 stress.

Figure 3:
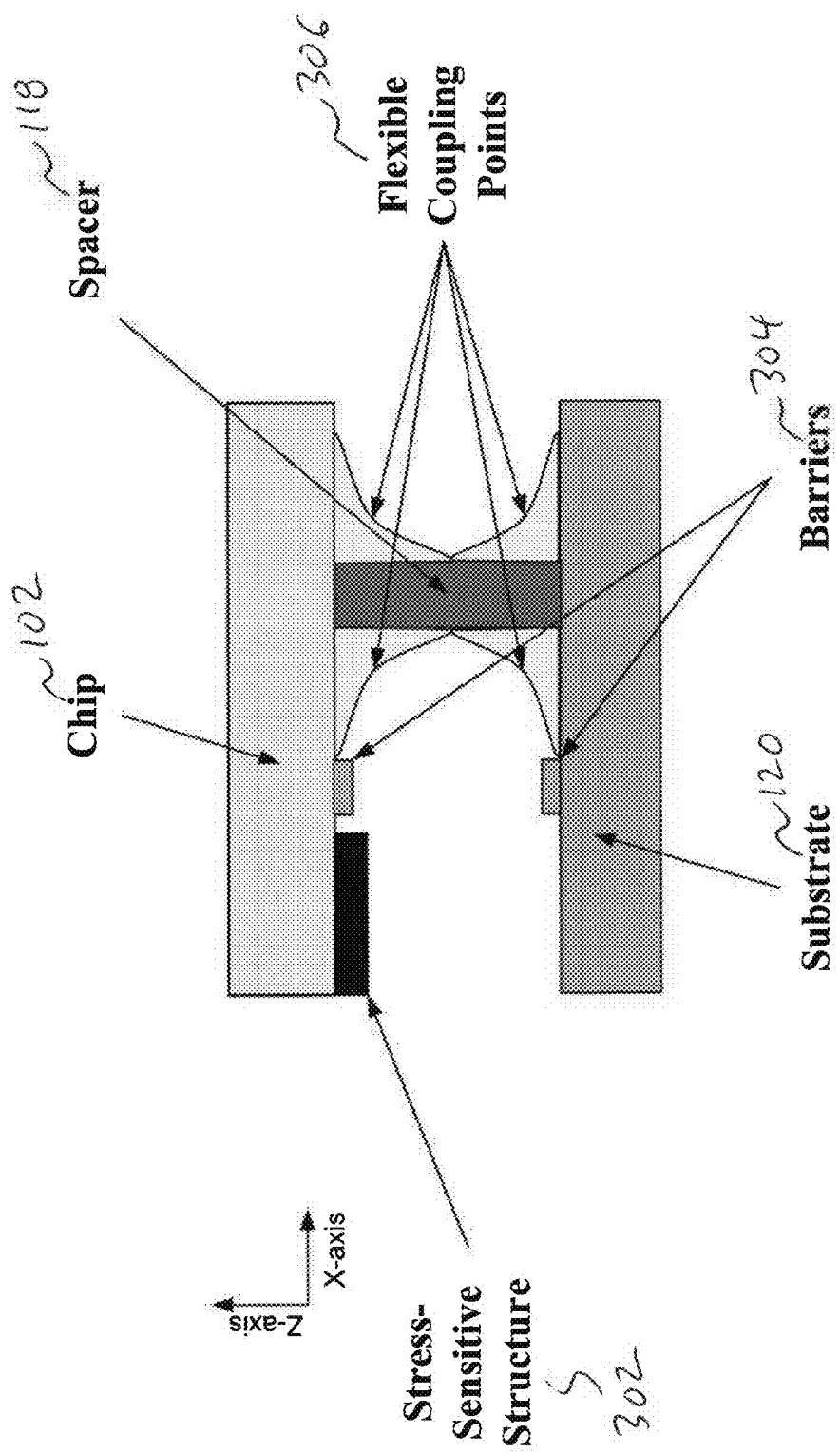
FIG. 3 shows one example of a flexible coupling point within a die interconnect.

FIG. 3 is one example of a flexible coupling point 306 within a die interconnect 100. In this example the spacer 118 is included in the flexible coupling area 116 to prevent tilting of the chip. The spacer 118 is surrounded with a flexible glue such as silicone. As can be seen, the glue can flow out toward a stress-sensitive structure 302 located in the overhang area 106.

Since glue contact with the stress-sensitive structure 302 might affect proper functioning of the structure 302, a set of barriers 304 are affixed to both the chip 102 and the substrate 120. In another example, the barrier 304 is inserted between a portion of the chip or substrate areas 104, 122 and either the rigid coupling area 110 or the flexible coupling area 116.

In various example embodiments, the barrier 304 can be formed from: a dam, a reservoir, a topography, a mask, a copper trace with a barrier mask, a polyimide coating, or a passivation layer.

Note that the stress-sensitive structure 302 can include a variety of structures which may be sensitive to stress, such as: a mechanical device, an electrical device, a sensor (e.g. pressure or otherwise), a functional electrical block, an electrical component (e.g. a resistor, a capacitor, etc.) and/or a functional parameter.

Figure 4:
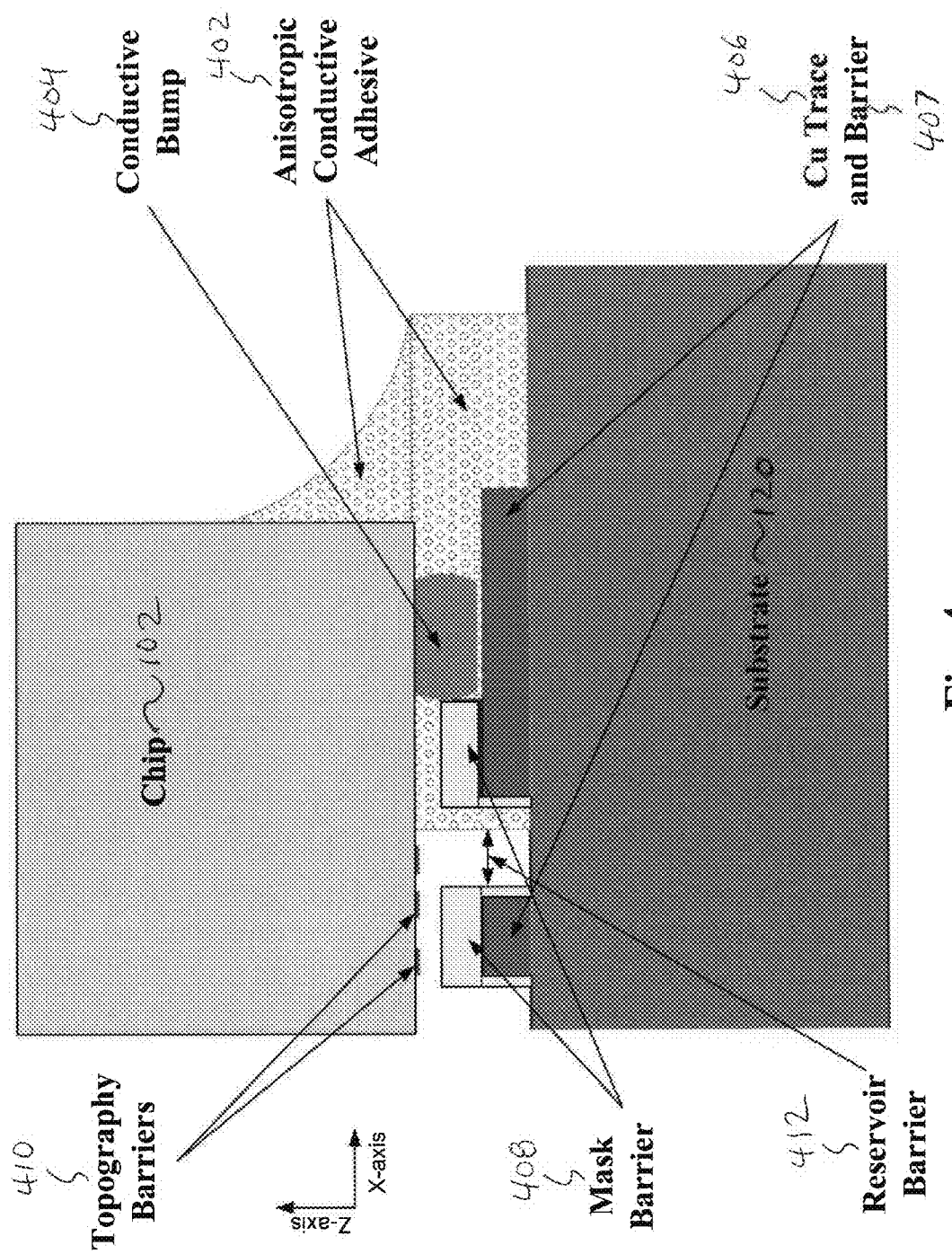
FIG. 4 shows one example of a rigid coupling point within a die interconnect.

FIG. 4 is one example of a rigid coupling point 112 within a die interconnect. The rigid coupling point 112 includes an anisotropic conductive adhesive (ACA) 402, a conductive bump 404, and a copper (Cu) trace 406. The conductive bump 404 electrically coupled to the chip 102 and the copper trace 406 is mechanically coupled to the substrate 120. The ACA glue 402 flows between the conductive bump 404 and the copper trace 406 forming an electrical coupling after cure. The copper trace 406 includes a barrier 407 which can be copper or another substance. In FIG. 4 the barrier 407 is also formed from the copper trace 406. The barrier 407 helps prevent flow-out of the ACA glue 402 before the glue is cured. Other barriers to the ACA 402 glue include: a mask barrier 408, a topography barrier 410, and a reservoir barrier 412. As mentioned above, the ACA glue can be applied in the shape of an anisotropic conductive paste (ACP) or in the shape of anisotropic conductive foil (ACF).

Figure 5:
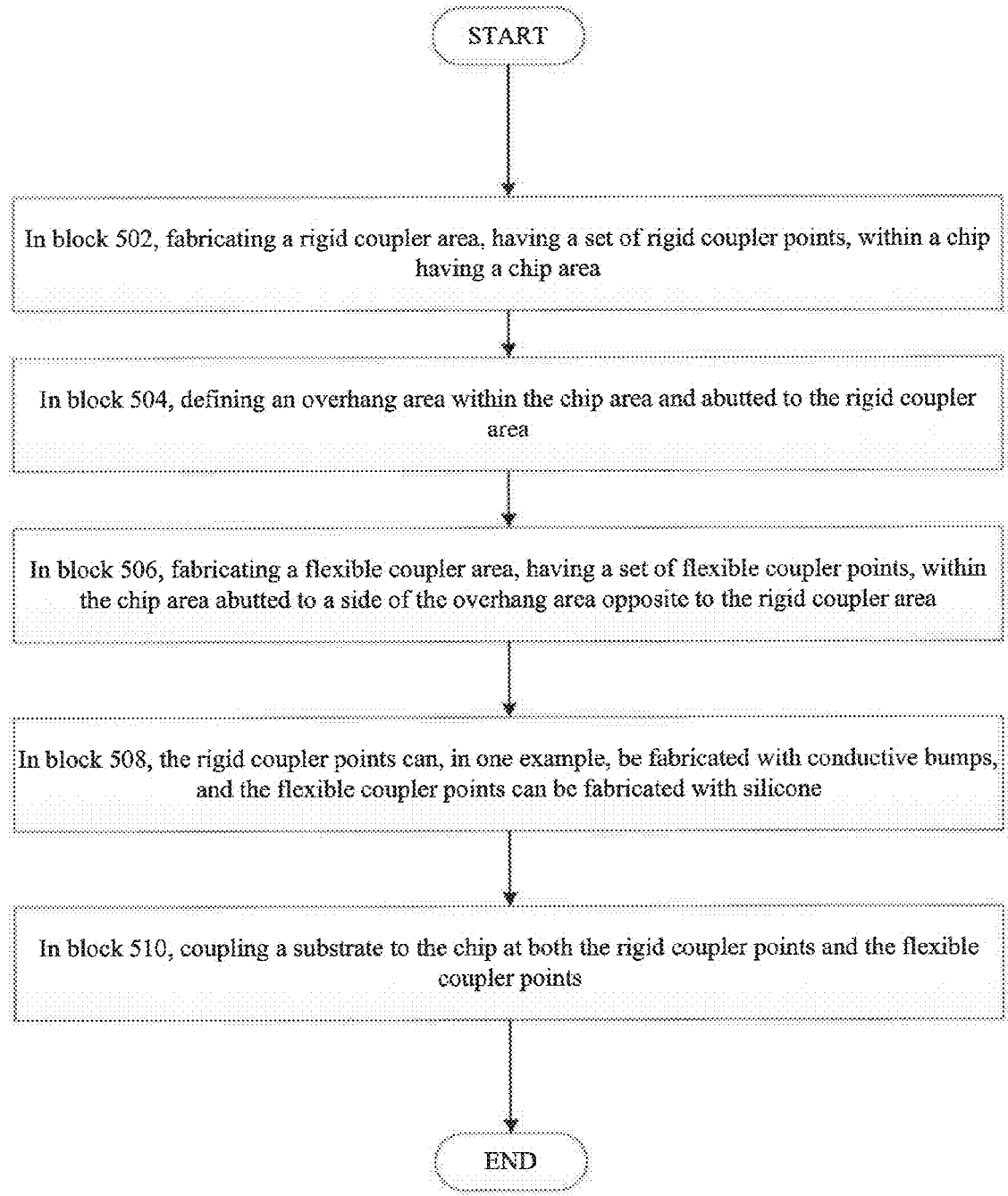
FIG. 5 lists one example of a method for fabricating a die interconnect.

FIG. 5 lists one example of a method 500 for fabricating a die interconnect. The method 500 begins in block 502, by fabricating a rigid coupler area, having a set of rigid coupler points, within a chip having a chip area. In block 504, defining an overhang area within the chip area and abutted to the rigid coupler area. Then in block 506, fabricating a flexible coupler area, having a set of flexible coupler points, within the chip area abutted to a side of the overhang area opposite to the rigid coupler area. In block 508, the rigid coupler points can, in one example, be fabricated with conductive bumps, and the flexible coupler points can be fabricated with silicone. Then in block 510, a substrate is coupled to the chip at both the rigid coupler points and the flexible coupler points.

The blocks comprising the flowcharts in the above Figures can be executed in any order, unless a specific order is explicitly stated. Also, those skilled in the art will recognize that while one example method embodiment is now discussed, the material in this specification can be combined in a variety of ways to yield other examples as well. The method next discussed is to be understood within a context provided by this and other portions of this detailed description.

Example embodiments discussed in this specification can be implemented in whole or in part within a variety of electronic, and non-electronic devices, apparatus, systems and structures.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. Die interconnect, comprising:
a rigid chip having a chip area, a first side and a second side, wherein the chip area includes:
   a contiguous overhang area on the first side of the chip;
   a contiguous rigid coupling area on the first side of the chip, having a set of rigid coupling points located on a first lateral side of the overhang area; and
   a contiguous flexible coupling area also on the first side of the chip, having a set of flexible coupling points located on a second lateral side of the overhang area opposite to the rigid coupling area located on the first lateral side;
   wherein the rigid chip is configured to be coupled to a substrate on the first side of the chip by the rigid and flexible coupling areas;
wherein the rigid coupling points are electrical coupling points; and
wherein the flexible coupling points are mechanical, but not electrical, coupling points.

2. The interconnect of claim 1, further comprising:
a set of spacers located within either the overhang area or the flexible coupling area.

3. The interconnect of claim 1, wherein:
the rigid coupling area is within an outer boundary; and
the flexible coupling area and overhang area are outside of the outer boundary.

4. The interconnect of claim 3, wherein the outer boundary encloses up to 50% of the chip area.

5. The interconnect of claim 1, wherein the chip is coupled to the substrate with the set of rigid and flexible coupling points.

6. The interconnect of claim 5, wherein the substrate includes at least one from a group consisting of: a second chip: a circuit board, ceramic substrate and glass.

7. The interconnect of claim 1:
wherein the chip includes a stress-sensitive structure located in the overhang area; and
wherein the stress-sensitive structure includes at least one from a group consisting of: a mechanical device, an electrical device, a sensor, a functional electrical block, an electrical component and a functional parameter.

8. The interconnect of claim 1, wherein the rigid coupling points include at least one from a group consisting of: an anisotropic conductive adhesive and a conductive bump.

9. The interconnect of claim 1, wherein the flexible coupling points include a silicone glue.

10. The interconnect of claim 1, further comprising:
a barrier between a portion of the chip area and either the rigid coupling area or the flexible coupling area.

11. The interconnect of claim 10, wherein the barrier is at least one from a group consisting of: a dam, a reservoir, a topography, a mask, and PI.

12. A method for fabricating a die interconnect, comprising:
fabricating a contiguous rigid coupler area, having a set of rigid coupler points, on a first side of a rigid chip having also a second side opposite to the first side;
defining a contiguous overhang area on the first side within the chip area and abutted to the rigid coupler area;
fabricating a contiguous flexible coupler area, having a set of flexible coupler points, within the chip area, located on a second lateral side of the overhang area opposite to the rigid coupler area located on a first lateral side; and
wherein the rigid coupler points are electrical coupler points; and
wherein the flexible coupler points are mechanical, but not electrical, coupler points.

13. The method of claim 12, further comprising:
coupling a substrate to the chip at both the rigid coupler points and the flexible coupler points.

14. The method of claim 12, further comprising:
fabricating the rigid coupler points with at least one from a group consisting of: anisotropic conductive adhesive, anisotropic conductive film and anisotropic conductive paste; and
fabricating the flexible coupler points with silicone.

* * * * *